United States Patent
Wang

(10) Patent No.: US 10,211,266 B2
(45) Date of Patent: Feb. 19, 2019

(54) ORGANIC LIGHT-EMITTING DIODES TOUCH DISPLAY PANEL AND ELECTRONIC DEVICE USING SAME

(71) Applicants: Interface Technology (ChengDu) Co., Ltd., Chengdu (CN); INTERFACE OPTOELECTRONICS (SHENZHEN) CO., LTD., Shenzhen (CN)

(72) Inventor: Juan Wang, Shenzhen (CN)

(73) Assignees: INTERFACE OPTOELECTRONIC (CHENGDU) CO., LTD., Chengdu (CN); INTERFACE OPTOELECTRONICS (SHENZHEN) CO., LTD., Shenzhen (CN)

( * ) Notice: Subject to any disclaimer, the term of this patent is extended or adjusted under 35 U.S.C. 154(b) by 46 days.

(21) Appl. No.: 15/086,467

(22) Filed: Mar. 31, 2016

(65) Prior Publication Data

US 2017/0186820 A1     Jun. 29, 2017

(30) Foreign Application Priority Data

Dec. 25, 2015   (CN) .......................... 2015 1 0985955

(51) Int. Cl.
*H01L 27/32*   (2006.01)
*H01L 51/52*   (2006.01)
(Continued)

(52) U.S. Cl.
CPC ........ *H01L 27/323* (2013.01); *G02F 1/13338* (2013.01); *G02F 1/133512* (2013.01);
(Continued)

(58) Field of Classification Search
CPC ...... G06F 3/0412; G06F 3/0416; G06F 3/042; G06F 3/0421; G06F 3/043; G06F 3/0436; G02F 1/13338; G02F 1/133512; G09G 3/3648; G09G 3/3208; H01L 27/323; H01L 27/3262; H01L 27/3272; H01L 27/3258; H01L 51/5284

See application file for complete search history.

(56) References Cited

U.S. PATENT DOCUMENTS

| | | | |
|---|---|---|---|
| 6,870,186 B2* | 3/2005 | Park | H01L 27/3253 257/40 |
| 7,142,179 B2* | 11/2006 | Miller | G09G 3/3233 345/76 |
| 8,052,498 B2* | 11/2011 | Chien | G06F 3/0412 430/313 |
| 8,946,711 B2* | 2/2015 | Ma | H01L 51/5284 257/40 |
| 9,263,704 B2* | 2/2016 | Yoo | H01L 51/5284 |
| 9,431,463 B2* | 8/2016 | Choi | H01L 27/322 |
| 9,606,606 B2* | 3/2017 | Kitchens, II | G06F 1/3215 |
| 9,671,638 B2* | 6/2017 | Lee | G02F 1/13338 |

(Continued)

*Primary Examiner* — Dismery Mercedes
(74) *Attorney, Agent, or Firm* — ScienBiziP, P.C.

(57) ABSTRACT

An OLED touch display panel capable of detecting and reacting to touches on the display includes a signal sending element emitting ultrasonic signals, a driving layer configured to provide display driving signals, a light-emitting element configured to receive the display driving signals and emit light, and a signal receiving element configured for receiving reflected ultrasonic signals. The light-emitting element includes a plurality of light-emitting units and a plurality of black matrixes. Every two adjacent light-emitting units are separated from each other by one of the black matrixes. The signal receiving element includes a plurality of thin film transistor units arranged in a matrix. Each thin film transistor unit is formed on one of the black matrixes.

16 Claims, 4 Drawing Sheets

(51) Int. Cl.
*G06F 3/043* (2006.01)
*G06F 3/041* (2006.01)
*G02F 1/1362* (2006.01)
*G02F 1/1335* (2006.01)
*G02F 1/1333* (2006.01)
*G09G 3/3208* (2016.01)

(52) U.S. Cl.
CPC ........ *G02F 1/136209* (2013.01); *G06F 3/041* (2013.01); *G06F 3/043* (2013.01); *G06F 3/0412* (2013.01); *G06F 3/0436* (2013.01); *H01L 27/3211* (2013.01); *H01L 27/3223* (2013.01); *H01L 27/3225* (2013.01); *H01L 27/3246* (2013.01); *H01L 51/5284* (2013.01); *G09G 3/3208* (2013.01); *H01L 27/3244* (2013.01); *H01L 27/3272* (2013.01)

(56) References Cited

U.S. PATENT DOCUMENTS

| | | | |
|---|---|---|---|
| 2004/0080262 A1* | 4/2004 | Park | H01L 27/3253 313/498 |
| 2010/0214247 A1* | 8/2010 | Tang | H03K 17/98 345/173 |
| 2011/0018893 A1* | 1/2011 | Kim | G06F 3/0412 345/589 |
| 2013/0201134 A1* | 8/2013 | Schneider | G06F 3/041 345/173 |
| 2016/0098140 A1* | 4/2016 | Lee | G06F 3/0416 345/173 |
| 2016/0218141 A1* | 7/2016 | Cai | H01L 33/06 |
| 2016/0293682 A1* | 10/2016 | Park | H01L 51/5275 |
| 2016/0313848 A1* | 10/2016 | Rhee | G06F 3/0412 |
| 2016/0372528 A1* | 12/2016 | Kamura | H01L 51/0096 |

* cited by examiner

ORGANIC LIGHT-EMITTING DIODES TOUCH DISPLAY PANEL AND ELECTRONIC DEVICE USING SAME

FIELD

The subject matter herein generally relates to organic light-emitting diodes (OLED) touch display panel, and an electronic device using the OLED touch display panel.

BACKGROUND

OLED touch display panels have received attention for its advantages, such as being lightweight and flexible due to plastic substrates, and having wider viewing angles and improved brightness.

BRIEF DESCRIPTION OF THE DRAWINGS

Implementations of the present technology will now be described, by way of example only, with reference to the attached figures.

DETAILED DESCRIPTION

Figure 1:
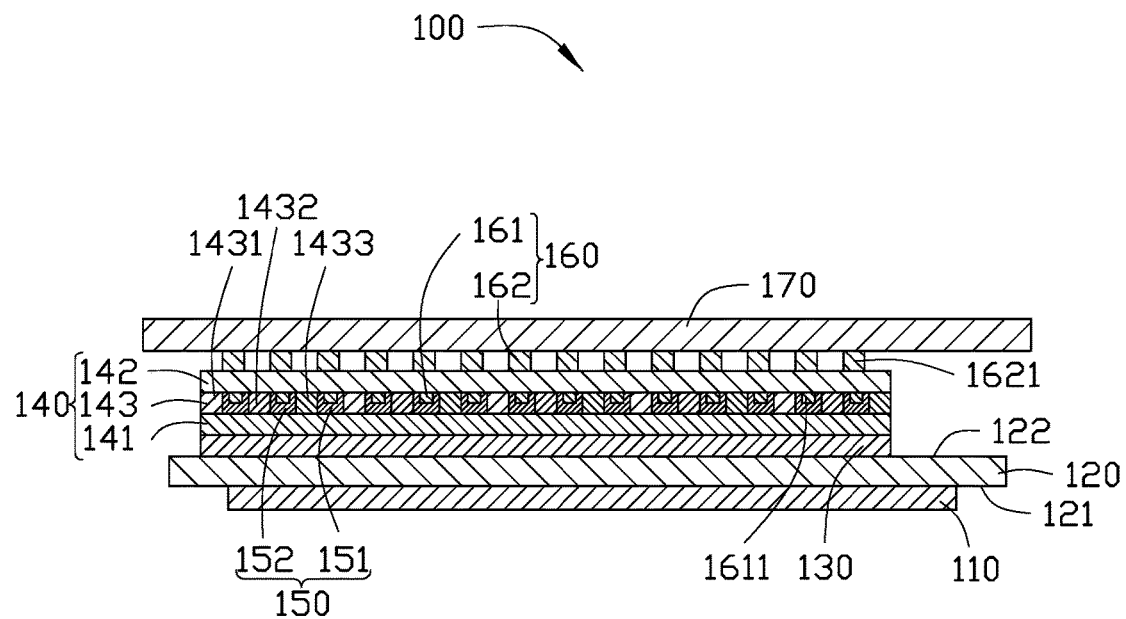
FIG. 1 is a cross-sectional view of a first exemplary embodiment of an OLED touch display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates an OLED touch display panel 100 according to a first exemplary embodiment. The OLED touch display panel 100 comprises a signal sending element 110, a substrate 120, a driving layer 130, a light-emitting element 140, a signal receiving element 160, and a cover 170. The signal sending element 110, the substrate 120, the driving layer 130, and the cover 170 are stacked in that order with the light-emitting element 140 and the signal receiving element 160 sandwiched between the driving layer 130 and the cover 170. The signal sending element 110 and the signal receiving element 160 form a touch sensor (not shown) configured to sense touches on the OLED touch display panel 100 and produce corresponding touching functions. The touch sensor may be an ultrasonic touch sensor. In at least one embodiment, the cover 170 is made of glass.

The substrate 120 has a first surface 121 and a second surface 122 opposite to the first surface 121. The signal sending element 110 is formed on the first surface 121 and is configured to emit ultrasonic signals continuously. The driving layer 130 is formed on the second surface 122 and is electrically connected to the light-emitting element 140. The driving layer 130 is configured to provide driving signals to the light-emitting element 140. The driving layer 130 may comprise a plurality of thin film transistors (TFTs, but not shown) arranged in arrays, a plurality of scan lines (not shown), a plurality of data lines (not shown), and a plurality of pixels. In at least one embodiment, the plurality of scan lines extends along a first direction while the plurality of data lines extends along a second direction perpendicular to the first direction. Each scan line is insulated from the data lines. Each pixel is defined as being that area between two neighboring data lines and two neighboring scan lines crossing each other in pairs. Each pixel has one TFT located therein.

The light-emitting element 140 and the signal receiving element 160 are located between the driving layer 130 and the cover 170. The light-emitting element 140 is configured to emit light for display and comprises a first electrode layer 141, a second electrode layer 142 formed on the first electrode layer 141, and a light-emitting layer 143 located between the first electrode layer 141 and the second electrode layer 142. The first electrode layer 141 is formed on a surface of the driving layer 130 away from the substrate 120. The second electrode layer 142 is located between the light-emitting layer 143 and the cover 170. In other words, a distance between the first electrode layer 141 and the substrate 120 is less than a distance between the second electrode layer 143 and the substrate 120. The light-emitting layer 143 is able to emit light under the driving of the first electrode layer 141 and the second electrode layer 142. In this embodiment, the first electrode layer 141 is an anode and the second electrode layer 142 is a cathode.

In the illustrated embodiment, the light-emitting layer 143 is capable of emitting light of different colors and comprises a plurality of light-emitting units. In at least one embodiment, the light-emitting layer 143 comprises a plurality of first color light-emitting units 1431, a plurality of second color light-emitting units 1432, and a plurality of third color light-emitting units 1433. In the illustrated embodiment, each first color light-emitting unit 1431 emits red light, each second color light-emitting unit 1432 emits green light, and each third color light-emitting unit 1433 emits blue light. Every two adjacent light-emitting units in the light-emitting layer 143 emit light of different colors. A light-emitting group (not shown) is defined by one first color light-emitting unit 1431, one second color light-emitting unit 1432, and one third color light-emitting unit 1433, which are all adjacent to each other. Each light-emitting group corresponds to one pixel (not shown). The light-emitting layer 143 also comprises a plurality of black matrixes 150 located between the first electrode layer 141 and the second electrode layer 142. Each black matrix 150 is located between two adjacent light-emitting units. In other words, every two adjacent light-emitting units are separated from each other by one black matrix 150.

In the illustrated embodiment, the black matrixes 150 are divided into a plurality of first black matrixes 151 and a plurality of second black matrixes 152. Each first black matrix 151 is located between two adjacent light-emitting groups. Each second black matrix 152 is located between two adjacent light-emitting units in one light-emitting group. In at least one embodiment, size of area of each first black matrix 151 is equal to size of area of each second black matrix 152. In other embodiments, size of area of each first black matrix 151 is larger than size of area of each second black matrix 152.

The light-emitting layer 143 may be enclosed by transparent glue (not shown). The transparent glue seals the light-emitting layer 143 against water and air.

The signal receiving element 160 is configured for receiving reflected ultrasonic signals and outputs the reflected ultrasonic signals to an outside circuit (not shown). The signal receiving element 160 comprises a TFT array 161 and a piezoelectric component 162.

The TFT array 161 comprises a plurality of TFT units 1611 arranged in a matrix. In the illustrated embodiment, each TFT unit 1611 is formed on one of the black matrixes 150 and located between the first electrode layer 141 and the second electrode layer 142. Furthermore, the TFT units 1611 are formed on both the first black matrixes 151 and on the second black matrixes 152. In other embodiments, the TFT units 1611 may be only formed on the second black matrixes 152. Each TFT unit 1611 is coupled to the piezoelectric component 162. Each TFT unit 1611 is also electrically connected to the outside circuit (not shown) via a flexible printed circuit board for example.

The piezoelectric component 162 comprises a plurality of piezoelectric units 1621 arranged in a matrix. The plurality of piezoelectric units 1621 is located between the cover 170 and the second electrode layer 142. Each piezoelectric unit 1621 corresponds to one TFT unit 1611 and to one of the pixels (not shown). Each piezoelectric unit 1621 may be made of polyvinylidene fluoride. The piezoelectric units 1621 can be directly formed on a surface of the cover 170 adjacent to the driving layer 130 or on a surface of the second electrode layer 142 away from the driving layer 130.

In use, the signal sending element 110 of the panel 100 emits ultrasonic signals continuously. A portion of the ultrasonic signals passes through the substrate 120, the driving layer 130, the light-emitting element 140, and the cover 170. If a human finger is touching the cover 170, a portion of the ultrasonic signals is absorbed by the finger and another portion of the ultrasonic signals is reflected by the finger to the signal receiving element 160. The ultrasonic signals from the cover 170 to the signal receiving element 160 is varied when the finger is touching the cover 170. Therefore, a corresponding function by touching can be produced.

Figure 2:
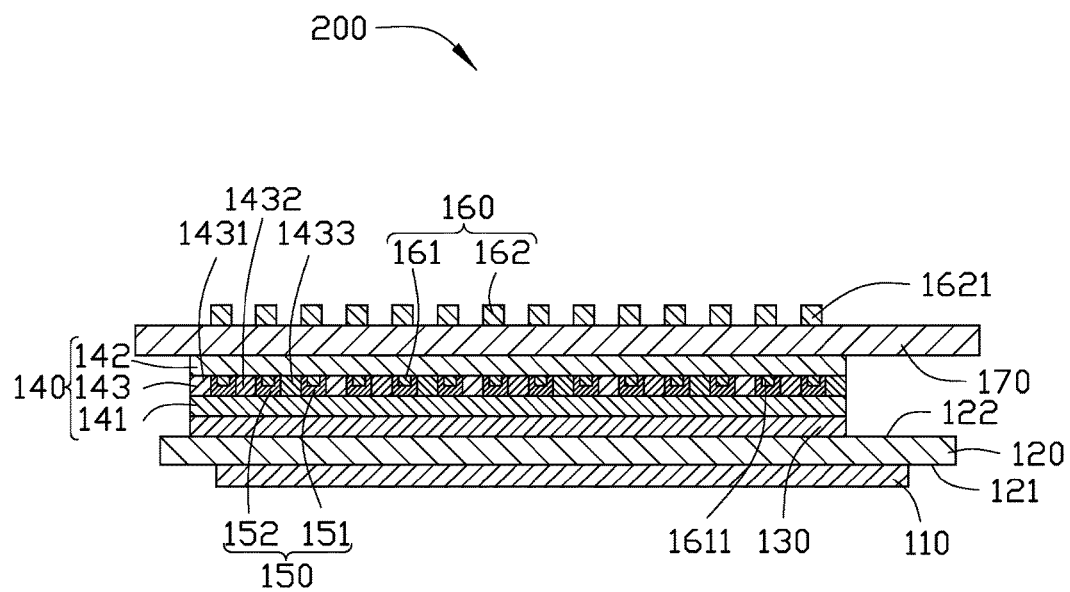
FIG. 2 is a cross-sectional view of a second exemplary embodiment of an OLED touch display panel.

FIG. 2 illustrates an OLED touch display panel 200 according to a second exemplary embodiment. The OLED touch display panel 200 also comprises a signal sending element 110, a substrate 120, a driving layer 130, a light-emitting element 140, a signal receiving element 160, and a cover 170. The OLED touch display panel 200 is similar to the OLED touch display panel 100 except that the plurality of piezoelectric units 1621 of the OLED touch display panel 200 is separately formed on a surface of the cover 170 away from the light-emitting element 140.

Figure 3:
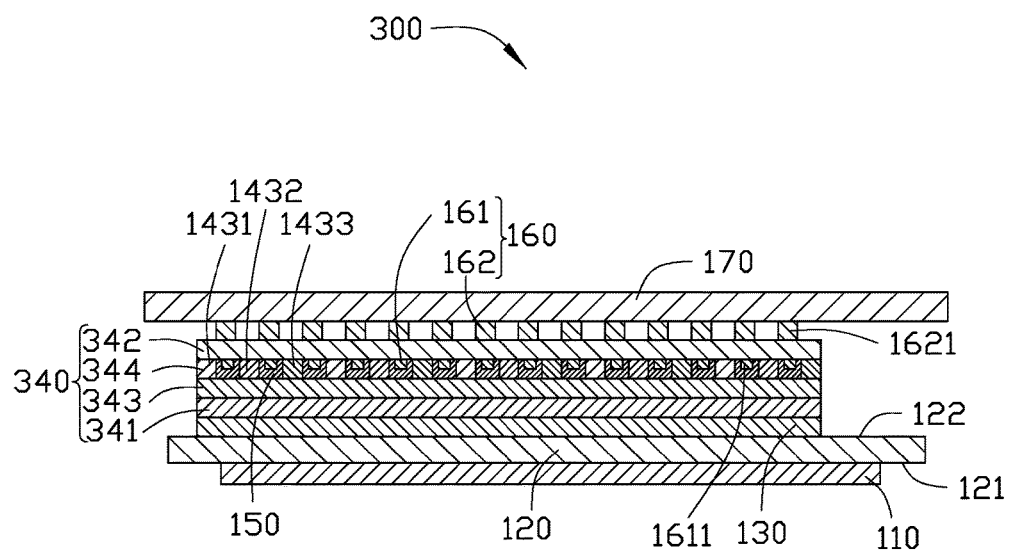
FIG. 3 is a cross-sectional view of a third exemplary embodiment of an OLED touch display panel.

FIG. 3 illustrates an OLED touch display panel 300 according to a third exemplary embodiment. The OLED touch display panel 300 is similar to the OLED touch display panel 100 except that the light-emitting element 340 of the OLED touch display panel 300 is different from light-emitting element 140 of OLED touch display panel 100. The light-emitting element 340 comprises a first electrode layer 341, a second electrode layer 342, and a light-emitting layer 343. The light-emitting layer 343 can only emit white light and the light-emitting element 340 further comprises a colorized filter layer 344 located between the light-emitting layer 343 and the second electrode layer 342. In other embodiments, the colorized filter layer 344 may also be formed on a surface of the second electrode layer 342 away from the light-emitting layer 343.

In at least one embodiment, the colorized filter layer 344 comprises a plurality of first color light-emitting units 3441, a plurality of second color light-emitting units 3442, and a plurality of third color light-emitting units 3443. Units 3441, 3442, and 3443 respectively emit the same colors of light as the units 1431, 1432, and 1433 described above. Every two adjacent light-emitting units in the light-emitting layer 343 emit light of different colors. Thus, white light passing through the colorized filter layer 344 can be converted to be colorized light. The colorized filter layer 344 also comprises a plurality of black matrixes 150. Each black matrix 150 is located between two adjacent light-emitting units. In other words, every two adjacent light-emitting units are separated from each other by one black matrix 150.

Figure 4:
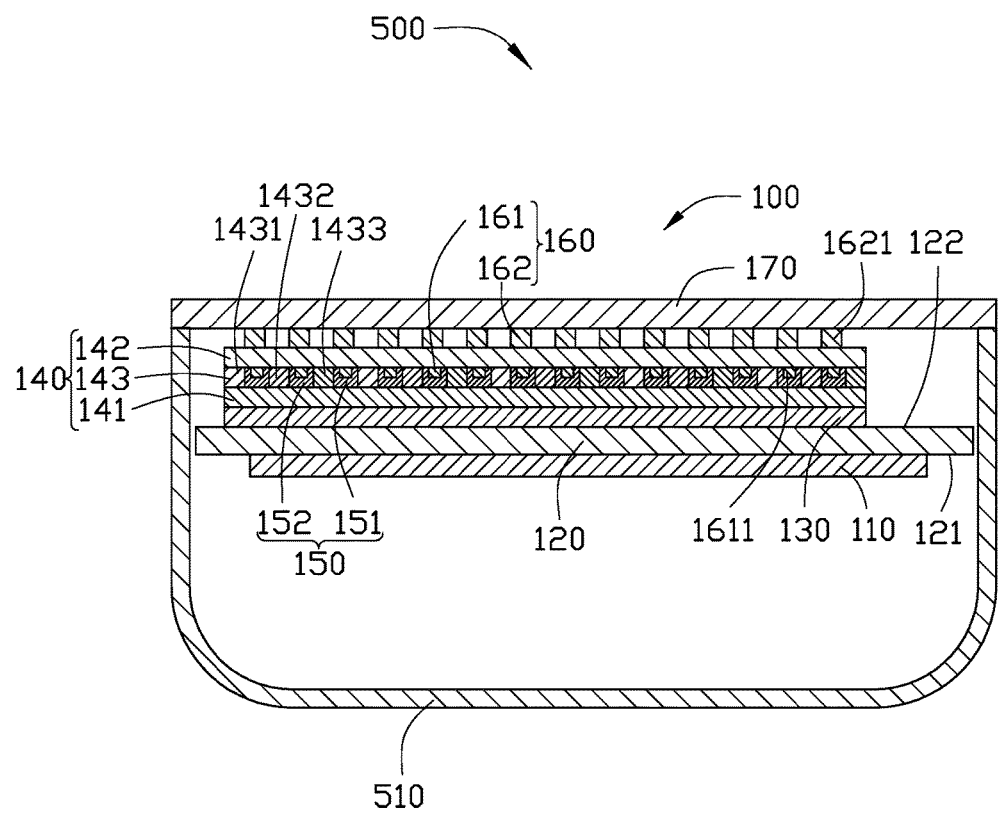
FIG. 4 is a cross-sectional view of an exemplary embodiment of an electronic device using the OLED touch display panel of FIG. 1.

FIG. 4 illustrates an electronic device 500 using the OLED touch display panel 100. The electronic device 500 may be a mobile phone or any other electronic device commonly used. The electronic device 500 also comprises a housing 510. The OLED touch display panel 100 is mounted on the housing 510. The OLED touch display panel 100 of the electronic device 510 can be replaced by the other embodiments of OLED touch display panels in this disclosure, such as the OLED touch display panel 200 or the OLED touch display panel 300.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An organic light-emitting diodes (OLED) touch display panel comprising:
    a substrate having a first surface and a second surface opposite to the first surface;
    a signal sending element formed on the first surface and configured to emit ultrasonic signals;
    a driving layer formed on the second surface and configured to provide display driving signals;
    a light-emitting element formed on a surface of the driving layer away from the substrate and configured to receive the display driving signals and emit light; and
    a signal receiving element configured to receive reflected ultrasonic signals and comprising a plurality of thin film transistor units arranged in matrix;
    wherein the light-emitting element comprises a first electrode layer, a second electrode layer formed on the first electrode layer, and a light-emitting layer located between the first electrode layer and the second electrode layer; the light-emitting layer emits light under the driving of the first electrode layer and the second electrode layer; the light-emitting layer comprises a plurality of light-emitting units and a plurality of black matrixes, the plurality of light-emitting units are arranged such that every two adjacent light-emitting units are separated from each other by one of the plurality of black matrixes; each of the plurality of thin film transistors units are formed on one of the black matrixes.

2. The OLED touch display panel of claim 1, further comprising a cover formed on the light-emitting element.

3. The OLED touch display panel of claim 2, wherein the signal receiving element further comprises a piezoelectric component comprising a plurality of piezoelectric units arranged in matrix, the plurality of piezoelectric units are located between the cover and the light-emitting element.

4. The OLED touch display panel of claim 2, wherein the signal receiving element further comprises a piezoelectric component comprising a plurality of piezoelectric units arranged in matrix, the plurality of piezoelectric units is formed on a surface of the cover away from the light-emitting element.

5. The OLED touch display panel of claim 1, wherein the light-emitting layer is capable of emitting light of different colors and comprises the light-emitting units; the light-emitting units are divided into a plurality of first color light-emitting units, a plurality of second color light-emitting units, and a plurality of third color light-emitting units.

6. The OLED touch display panel of claim 5, wherein a light-emitting group is defined by one of the first color light-emitting units, one of the second color light-emitting units, and one of the third color light-emitting units which are adjacent to each other.

7. The OLED touch display panel of claim 6, wherein each first color light-emitting unit emits red light, each second color light-emitting unit emits green light, and each third color light-emitting unit emits blue light.

8. The OLED touch display panel of claim 1, wherein the light-emitting layer is able to emit white light and the light-emitting element further comprises a color filter layer located between the light-emitting layer and the second electrode layer, the color filter layer comprises the light-emitting units which are divided into a plurality of first color light-emitting units, a plurality of second color light-emitting units, and a plurality of third color light-emitting units.

9. The OLED touch display panel of claim 1, wherein each thin film transistor unit is located between the first electrode layer and the second electrode layer.

10. An electronic device comprising:
an OLED touch display panel comprising:
a substrate having a first surface and a second surface opposite to the first surface;
a signal sending element formed on the first surface and configured to emit ultrasonic signals;
a driving layer formed on the second surface and configured to provide display driving signals;
a light-emitting element formed on a surface of the driving layer away from the substrate and configured to receive the display driving signals and emit light; and
a signal receiving element configured to receive reflected ultrasonic signals and comprising a plurality of thin film transistor units arranged in matrix;
wherein the light-emitting element comprises a first electrode layer, a second electrode layer formed on the first electrode layer, and a light-emitting layer located between the first electrode layer and the second electrode layer; the light-emitting layer emits light under the driving of the first electrode layer and the second electrode layer; the light-emitting layer comprises a plurality of light-emitting units and a plurality of black matrixes, the plurality of light-emitting units are arranged such that every two adjacent light-emitting units are separated from each other by one of the plurality of black matrixes; each of the plurality of thin film transistors units are formed on one of the black matrixes.

11. The electronic device of claim 10, further comprising a cover formed on the light-emitting element.

12. The electronic device of claim 11, wherein the signal receiving element further comprises a piezoelectric component comprising a plurality of piezoelectric units arranged in matrix, the plurality of piezoelectric units are located between the cover and the light-emitting element.

13. The electronic device of claim 11, wherein the signal receiving element further comprises a piezoelectric component comprising a plurality of piezoelectric units arranged in matrix, the plurality of piezoelectric units are formed on a surface of the cover away from the light-emitting element.

14. The electronic device of claim 10, wherein the light-emitting layer is capable of emitting light of different colors and comprises the light-emitting units; the light-emitting units are divided into a plurality of first color light-emitting units, a plurality of second color light-emitting units, and a plurality of third color light-emitting units.

15. The electronic device of claim 14, wherein the each first color light-emitting unit emits red light, each second color light-emitting unit emits green light, and each third color light-emitting unit emits blue light.

16. The electronic device of claim 15, wherein each thin film transistor unit is located between the first electrode layer and the second electrode layer.

* * * * *